United States Patent
Cho

(10) Patent No.: US 10,396,827 B2
(45) Date of Patent: *Aug. 27, 2019

(54) DATA STORAGE DEVICE

(71) Applicant: SK hynix Inc., Gyeonggi-do (KR)

(72) Inventor: Kyoung Lae Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/138,512

(22) Filed: Sep. 21, 2018

(65) Prior Publication Data

US 2019/0028123 A1 Jan. 24, 2019

Related U.S. Application Data

(63) Continuation-in-part of application No. 15/016,443, filed on Feb. 5, 2016, now Pat. No. 10,102,066.

(30) Foreign Application Priority Data

Sep. 25, 2015 (KR) .................. 10-2015-0136362

(51) Int. Cl.
*H03M 13/11* (2006.01)
*H03M 13/37* (2006.01)
*G06F 11/10* (2006.01)
*G06F 3/06* (2006.01)

(52) U.S. Cl.
CPC ........ *H03M 13/3707* (2013.01); *G06F 3/064* (2013.01); *G06F 3/0619* (2013.01); *G06F 3/0659* (2013.01); *G06F 3/0679* (2013.01); *G06F 11/1076* (2013.01); *H03M 13/1108* (2013.01); *H03M 13/1111* (2013.01)

(58) Field of Classification Search
CPC ..................................... H04L 1/0057
USPC ................ 714/776, 774, 775, 788
See application file for complete search history.

(56) References Cited

U.S. PATENT DOCUMENTS

| | | | |
|---|---|---|---|
| 9,009,567 B2* | 4/2015 | Baptist .............. | H04L 67/1097 709/215 |
| 2014/0068320 A1* | 3/2014 | Vedpathak ........ | G06F 21/6272 714/6.2 |
| 2016/0011939 A1* | 1/2016 | Luby ................. | G06F 11/1076 714/764 |
| 2016/0154698 A1* | 6/2016 | Kazi .................. | G06F 11/1092 714/766 |

* cited by examiner

*Primary Examiner* — Fritz Alphonse
(74) *Attorney, Agent, or Firm* — IP & T Group LLP

(57) ABSTRACT

A data storage device includes a nonvolatile memory device configured to read and output a plurality of data chunks; and a data processing block configured to perform decoding on the data chunks, the data processing block comprising a sequencer configured to generate a decoding information on the data chunks; and a core circuit configured to perform normal decoding on a first data chunk among the data chunks based on the decoding information, and perform fast decoding on a second data chunk among the data chunks depending on whether a result of the normal decoding satisfies a fast decoding condition, wherein the fast decoding requires a shorter execution time than the normal decoding.

14 Claims, 8 Drawing Sheets

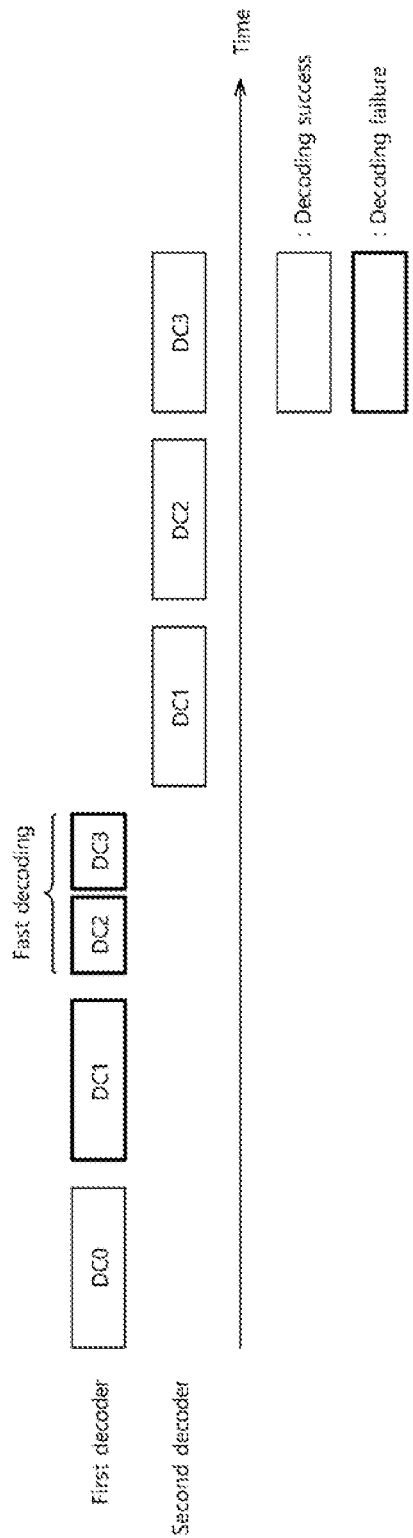
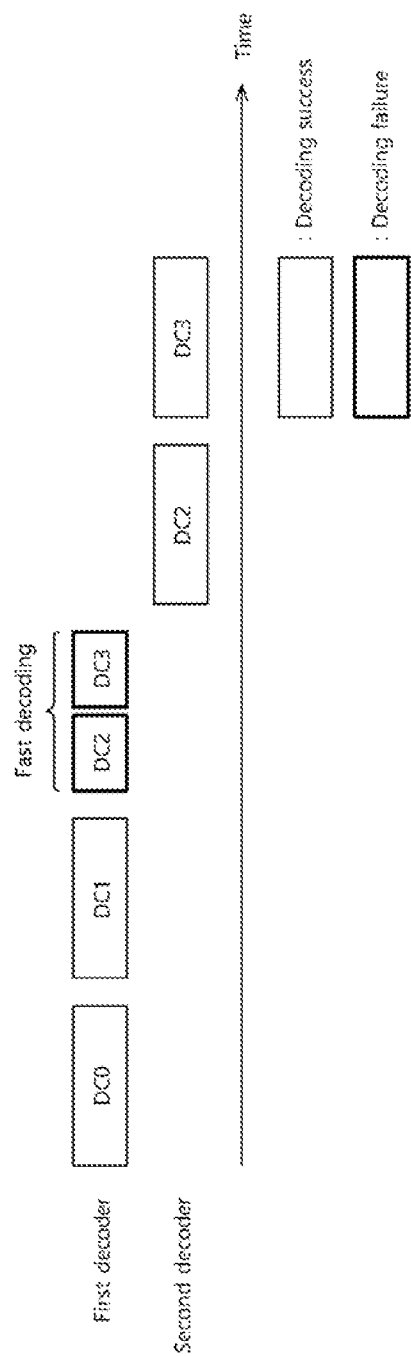

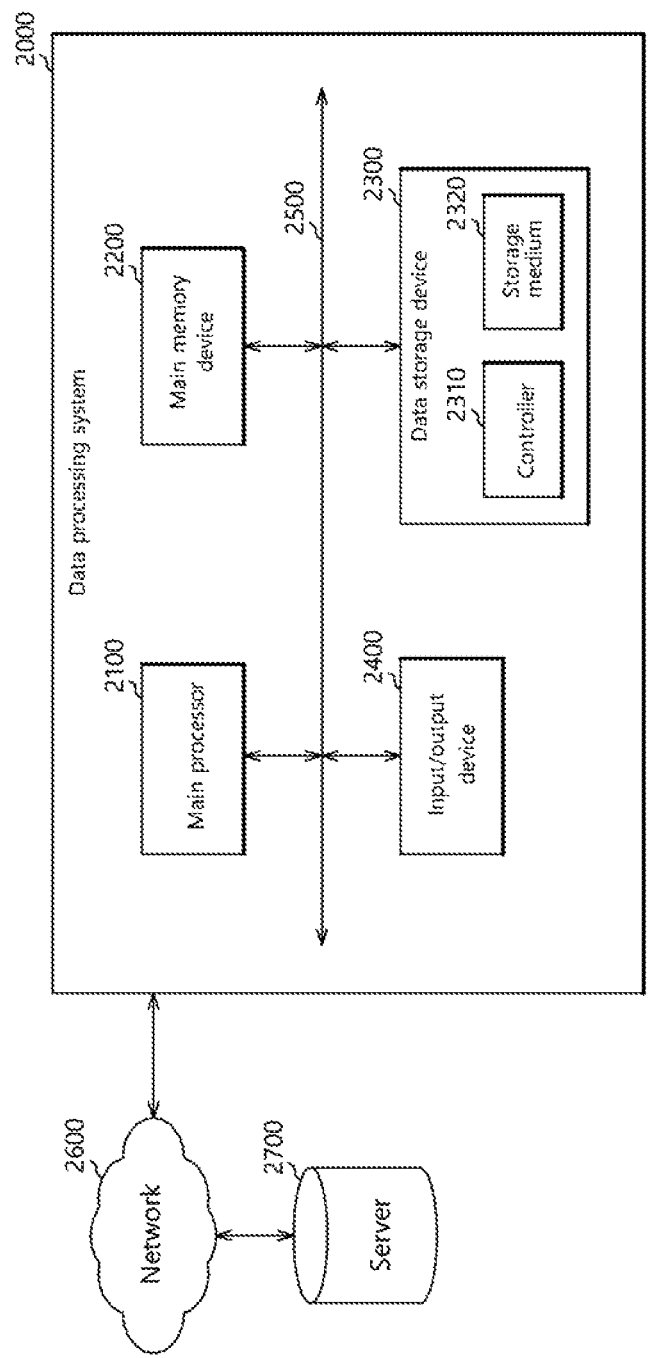

DATA STORAGE DEVICE

CROSS-REFERENCES TO RELATED APPLICATION

The present application is a continuation-in-part application of U.S. application Ser. No. 15/016,443, filed on Feb. 5, 2016, which claims priority under 35 U.S.C. § 119(a) to Korean application number 10-2015-0136362, filed on Sep. 25, 2015. The disclosure of each of the foregoing applications is incorporated herein by reference in its entirety.

BACKGROUND

1. Technical Field

Various embodiments generally relate to a data processing device and more particularly, to a data processing device having an improved data correction capability.

2. Related Art

Data storage devices store data provided by an external device in response to a write request. The data storage devices may also provide stored data to an external device in response to a read request. Examples of external devices employing one or more data storage devices include computers, digital cameras, cellular phones and the like. The data storage devices may be embedded in the external devices or may be fabricated in a separate form and connected to the external devices to operate.

Data storage devices may include a data processing device for performing a decoding operation for correcting errors in data read from a memory device.

SUMMARY

In an embodiment, a data storage device may include a nonvolatile memory device configured to read and output a plurality of data chunks; and a data processing block configured to perform decoding on the data chunks, the data processing block comprising a sequencer configured to generate a decoding information on the data chunks; and a core circuit configured to perform normal decoding on a first data chunk among the data chunks based on the decoding information, and perform fast decoding on a second data chunk among the data chunks depending on whether a result of the normal decoding satisfies a fast decoding condition, wherein the fast decoding requires a shorter execution time than the normal decoding.

BRIEF DESCRIPTION OF THE DRAWINGS

FIGS. 2A and 2B are diagrams illustrating a method for decoding a plurality of data chunks, according to an embodiment of the invention.

FIG. 9 is a block diagram illustrating a data processing system including a data storage device, according to an embodiment of the invention.

DETAILED DESCRIPTION

Figure 1:
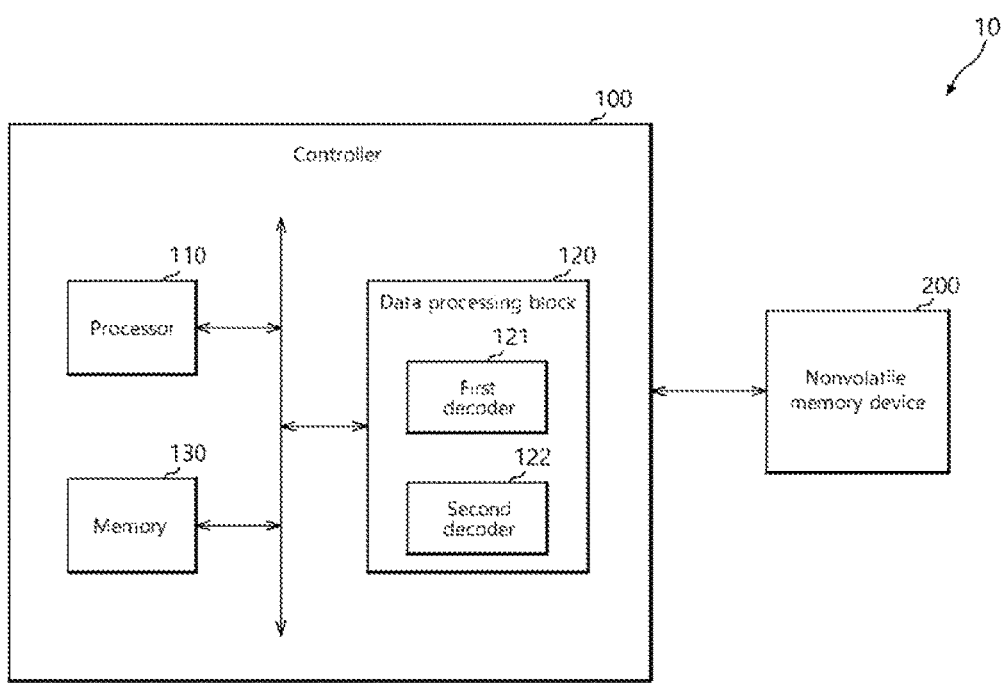
FIG. 1 is a block diagram illustrating a data storage device including a data processing block, according to an embodiment of the invention.

Hereinafter, various embodiments of the invention will be described with reference to the accompanying drawings. The invention may, however, be embodied in different forms and should not be construed as being limited to the embodiments set forth herein. Rather, these embodiments are provided so that a person skilled in the art to which the invention pertains could practice the invention.

Moreover, it is to be understood, that embodiments of the invention are not limited to the particulars shown in the drawings, that the drawings are not necessarily to scale and, in some instances, proportions may have been exaggerated in order to more clearly depict certain features of the invention. Also, while particular terminology is used, it is to be appreciated that the terminology used is for describing particular embodiments only and is not intended to limit the scope of the invention.

Referring now to FIG. 1 a data storage device 10 is provided, according to an embodiment of the invention. The data storage device may be any suitable data storage device. For example, the data storage device 10 may be or comprise a personal computer memory card international association (PCMCIA) card, a compact flash (CF) card, a smart media card, a memory stick, a multimedia card (MMC), an embedded MMC (eMMC), a reduced-size multimedia card (RS-MMC), a micro-size version of MMC (MMC-micro), a secure digital (SD) card, a mini secure digital (mini-SD) card, a micro secure digital (micro-SD) card, a universal flash storage (UFS), a solid state drive (SSD), or the like.

The data storage device 10 may include a controller 100 and a nonvolatile memory device 200.

The controller 100 may include a processor 110, a data processing block 120, and a memory 130. The data processing block 120 may include a first decoder 121 and a second decoder 122.

The processor 110 may control the general operations of the data storage device 10. For example, the processor 110 may store data in the nonvolatile memory device 200 in response to a write request transmitted from an external device (not shown). The processor 110 may read data stored in the nonvolatile memory device 200 and output the read data to an external device (not shown) in response to a read request transmitted from the external device.

The processor 110 may control the data processing block 120 to encode data to be stored in the nonvolatile memory device 200 and decode data read from the nonvolatile memory device 200. The processor 110 may control a first decoder 121 of the data processing block 120 to perform a first decoding operation for a plurality of data chunks read sequentially from the nonvolatile memory device 200. The processor 110 may control a second decoder 122 of the data processing block 120 to perform an additional second decoding operation for one or more data chunks selected among the plurality of data chunks for which the first decoding operation failed, in response to a decoding failure report transmitted from the first decoder 121. The first and second decoding operations will be described hereinafter in more detail.

The data processing block 120 may determine whether data read from the nonvolatile memory device 200 includes an error bit, and may correct the error bit.

According to an embodiment, the first decoder 121 may perform a first decoding operation according to an iterative decoding algorithm. According to the first decoding operation, the first decoder 121 may iterate decoding calculations until all error bits included in data are corrected or until a maximum number of iterations has been reached. Decoding calculations may be repeated up to a maximum preset number of times defined by a maximum iteration count. Hence, it is possible, in the case where data include too many error bits, the first decoder 121 may fail in decoding the data even though decoding calculations are iterated to the maximum iteration count. According to an embodiment, the second decoder 122 may also perform a second decoding operation according to an iterative decoding algorithm.

The first decoder 121 and the second decoder 122 may perform decoding in a stepwise manner. For example, the first decoder 121 may perform a first decoding operation for data read from the nonvolatile memory device 200 and then, the second decoder 122 may perform an additional second decoding operation for the data for which the first decoding operation failed. Performing a second decoding operation for only those data for which a first decoding operation failed may reduce the number of errors in the read data while at the same time may reduce the number of iterations, hence improving the overall efficiency of the data processing block 120 and the associated data controller 100 and storage device 10.

The first decoder 121 and the second decoder 122 may perform decoding according to the same or different decoding algorithms. The first decoder 121 and the second decoder 122 may perform decoding according to different decoding algorithms or different decoding schemes. For example, the first decoder 121 may perform decoding in a hard decision decoding scheme according to an LDPC algorithm, and the second decoder 122 may perform decoding in a soft decision decoding scheme according to a low-density parity-check (LDPC) algorithm. The first decoder 121 and the second decoder 122 may have error correction capabilities complementary to each other, by applying different decoding algorithms for data. Accordingly, the error correction capability of the data processing block 120 may be improved.

The first decoder 121 and the second decoder 122 may perform decoding on a predetermined decoding data unit. For example, the first decoder 121 and the second decoder 122 may perform decoding on the basis of a data chunk. The size of each data chunk may be the same or may differ.

The first and second decoders 121, 122 may perform their respective first and second decoding operations on data chunks having the same size. The first and second decoders 121, 122 may perform their respective first and second decoding operations on different size data chunks. In an embodiment, the controller 100 may receive a plurality of data chunks, read sequentially from the nonvolatile memory device 200, and the first and second decoders 121, 122 may perform their respective first and second decoding operations for one or more of the plurality of data chunks.

In an embodiment, the first decoder 121 may perform a normal decoding for one or more data chunks among a plurality of data chunks read sequentially from the nonvolatile memory device 200. Then, based on one or more results of the normal decoding on the one or more data chunks, the first decoder may perform the same or a modified, for example a fast decoding operation for one or more succeeding data chunks. According to an embodiment, the one or more succeeding data chunks may be remaining data chunks for which normal decoding is not yet performed by the first decoder, among the plurality of data chunks. While sequentially performing normal decoding for the plurality of data chunks, the first decoder 121 may determine whether to continue performing normal decoding or perform a modified decoding instead, for example, a fast decoding for one or more of the remaining data chunks, based on a result of normal decoding performed previously. The result of normal decoding may include information on whether normal decoding has succeeded or failed, information on an iteration count of successful normal decoding and/or information on the number of errors corrected in normal decoding. The term "normal" of normal decoding is used to allow normal decoding to be distinguished from a modified decoding e.g. a fast decoding. Normal decoding may be performed according to any suitable conventional method.

In an embodiment, the first decoder 121 may perform fast decoding to more quickly end decoding for a succeeding data chunk. For example, a fast decoding may be used when inefficient decoding for a succeeding data chunk may be expected based on a result of normal decoding performed previously. For example, when it is expected that decoding may fail or a long time may be required even though decoding may succeed, the first decoder 121 may perform a fast decoding for a succeeding one or more data chunks.

According to an embodiment, the first decoder 121 may perform fast decoding for a succeeding data chunk, when normal decoding for a previous data chunk has failed. According to an embodiment, the first decoder 121 may perform fast decoding for a succeeding data chunk, when the number of error bits corrected in normal decoding for a previous data chunk exceeds a threshold number of error bits. According to an embodiment, the first decoder 121 may perform fast decoding for a succeeding data chunk, when an iteration count of successful normal decoding for a previous data chunk, that is, a success iteration count, exceeds a threshold iteration count. According to an embodiment, the first decoder 121 may perform fast decoding for a succeeding data chunk, based on a combination of two or more of the above conditions.

The first decoder 121 may perform fast decoding in various ways. According to an embodiment, the first decoder 121 may perform fast decoding by processing a succeeding data chunk in a bypass mode. When the first decoder 121 is set in the bypass mode, the succeeding data chunk inputted to the first decoder 121 may be outputted as it is. According to an embodiment, the first decoder 121 may perform fast decoding by inserting an error bit in a succeeding data chunk and performing normal decoding for the error-inserted data chunk. According to an embodiment, when the first decoder 121 performs normal decoding within the limit of a first maximum iteration count according to an iterative decoding scheme, the first decoder 121 may perform fast decoding within the limit of a second maximum iteration count smaller than the first maximum iteration count. The second maximum iteration count may be set to, for example, "0" or "1."

According to an embodiment, when performing fast decoding for a succeeding data chunk through the above-described ways, the first decoder 121 may output a result of performing the fast decoding together with its input data chunk, i.e., the succeeding data chunk. For example, when the fast decoding is performed in such a manner that an error bit is inserted in the succeeding data chunk and then normal decoding is performed, the first decoder 121 may separately retain the original succeeding data chunk and output the separately retained original succeeding data chunk together with a fast decoding result. This may allow the second decoder 122 to perform additional decoding with a data chunk transferred from the first decoder 121. It will be described later in detail.

According to an embodiment, when the number of a plurality of data chunks which are sequentially read is smaller than a threshold number of chunks, the first decoder 121 may not perform fast decoding for the plurality of data chunks but the first decoder 121 may continuously perform only normal decoding.

According to an embodiment, the first decoder 121 may transmit a decoding failure report to the processor 110, with respect to a data chunk for which fast decoding is performed. According to an embodiment, the first decoder 121 may transmit identification information for allowing the processor 110 to identify a data chunk for which fast decoding is performed, among a plurality of data chunks. In response to the report from the first decoder 121, the processor 110 may control the second decoder 122 to perform additional decoding for not only a data chunk for which normal decoding has failed in the first decoder 121 but also a data chunk for which fast decoding has been performed in the first decoder 121. It will be described later in detail.

The second decoder 122 may perform additional decoding for data chunks selected among a plurality of data chunks which are sequentially read. The selected data chunks may include a data chunk for which normal decoding has failed in the first decoder 121 and a data chunk for which fast decoding has been performed in the first decoder 121. In order to perform the additional decoding, the first decoder 121 may retain original data chunks and transfer them to the second decoder 122.

While the data processing block 120 of FIG. 1 includes two decoders 121 and 122, it is to be noted that, according to an embodiment, the data processing block 120 may include a plurality of decoders, i.e., three or more decoders. One or more of the plurality of decoders included in the data processing block 120 may perform fast decoding based on a result of normal decoding for a plurality of data chunks which are sequentially read, as described above. The plurality of decoders may perform decoding in a stepwise manner according to respective decoding algorithms different from each other, and may perform additional decoding for data chunks for which decoding has failed in previous decoders.

The memory 130 may serve as a working memory, a cache memory or a buffer memory of the processor 110. The memory 130 as a working memory may store software programs and various program data to be driven by the processor 110. The memory 130 as a cache memory may temporarily store cache data. The memory 130 as a buffer memory may temporarily store data transmitted between the external device and the nonvolatile memory device 200.

The nonvolatile memory device 200 may include flash memory devices such as NAND flash or NOR flash, Ferro-electrics Random Access Memory (FeRAM), Phase-Change Random Access Memory (PCRAM), Magnetoresistive Random Access Memory (MRAM) or Resistive Random Access Memory (ReRAM). The nonvolatile memory device 200 may store data transmitted from the controller 100 and may read stored data and transmit read data to the controller 100, under the control of the controller 100.

While the data storage device 10 of FIG. 1 includes one nonvolatile memory device 200, it is to be noted that the number of nonvolatile memory devices included in the data storage device 10 is not specifically limited.

FIGS. 2A and 2B are diagrams illustrating a method for the data processing block 120 of FIG. 1 to decode a plurality of data chunks. In FIGS. 2A and 2B, the data processing block 120 may perform a first decoding for example, for 4 data chunks DC0 to DC3 which are sequentially read.

Referring to FIG. 2A, the first decoder 121 may sequentially process data chunks DC0 to DC3. The first decoder 121 may determine whether to perform a fast decoding for a succeeding data chunk, based on whether normal decoding for a previous data chunk is a success or a failure.

First, the first decoder 121 may perform normal decoding for the first data chunk DC0. When the normal decoding for the first data chunk DC0 is a success, the first decoder 121 may perform normal decoding for the second data chunk DC1. Then, when the normal decoding for the second data chunk DC1 is a failure, the first decoder 121 may perform fast decoding for the succeeding data chunks DC2 and DC3. The first decoder 121 may transmit a decoding failure report to the processor 110, with respect to the second data chunk DC1 for which the normal decoding has failed and the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the second data chunk DC1 for which the normal decoding has failed in the first decoder 121 and the third and fourth data chunks DC2 and DC3 for which the fast decoding has been performed in the first decoder 121.

Referring to FIG. 2B, the first decoder 121 may determine whether to perform fast decoding for a succeeding data chunk, based on the number of error bits corrected in normal decoding for a previous data chunk.

First, the first decoder 121 may perform normal decoding for the first data chunk DC0. When the number of error bits corrected in the normal decoding for the first data chunk DC0 does not exceed a threshold number of error bits, the first decoder 121 may also perform normal decoding for the second data chunk DC1. Then, when the number of error bits corrected in the normal decoding for the second data chunk DC1 exceeds the threshold number of error bits, the first decoder 121 may perform fast decoding for the succeeding data chunks DC2 and DC3. The first decoder 121 may transmit a decoding failure report to the processor 110, with respect to the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the third and fourth data chunks DC2 and DC3 for which the fast decoding has been performed in the first decoder 121.

According to an embodiment, the first decoder 121 may determine whether to perform fast decoding for a succeeding data chunk, based on a success iteration count of normal decoding for a previous data chunk.

Figure 3:
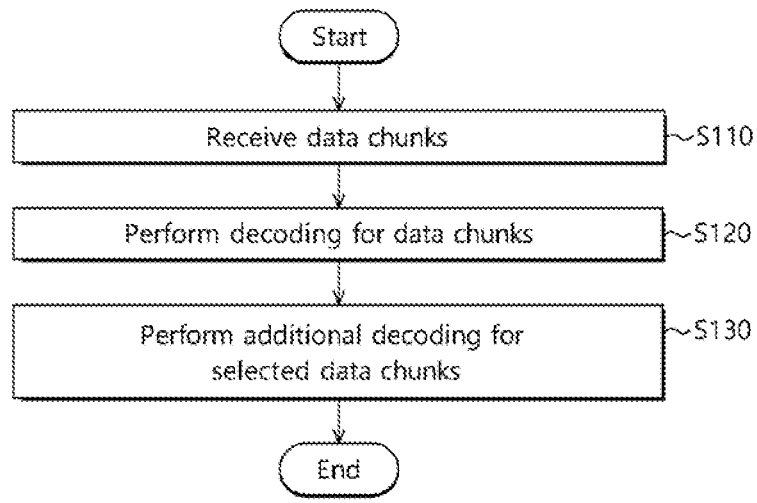
FIG. 3 is a flow chart illustrating a method for operating a data storage device, according to an embodiment of the invention.

FIG. 3 is a flow chart illustrating a method for operating the data storage device 10 of FIG. 1.

At step S110, the controller 100 may receive a plurality of data chunks which are read sequentially from the nonvolatile memory device 200.

At step S120, the first decoder 121 may perform decoding sequentially for the plurality of data chunks. As aforementioned, the first decoder 121 may perform normal decoding or fast decoding for a succeeding data chunk, based on a result of normal decoding for a previous data chunk. The first decoder 121 may transmit a decoding failure report to the processor 110, with respect to a data chunk for which normal decoding has failed and a data chunk for which fast decoding has been performed.

At step S130, the second decoder 122 may perform additional decoding for data chunks selected among the plurality of data chunks. For example, the second decoder 122 may perform additional decoding for a data chunk for which normal decoding has failed in the first decoder 121 and/or a data chunk for which fast decoding has been performed in the first decoder 121. The second decoder 122 may perform decoding according to a decoding algorithm different from the decoding algorithm employed by the first decoder 121. In an embodiment, the second decoder 122 may perform decoding according to a decoding algorithm that is the same as the decoding algorithm used by the first decoder 121. The decoding algorithm employed by the second decoder 122 may be complimentary to the decoding algorithm employed by the first decoder allowing different data errors to be corrected.

Figure 4:
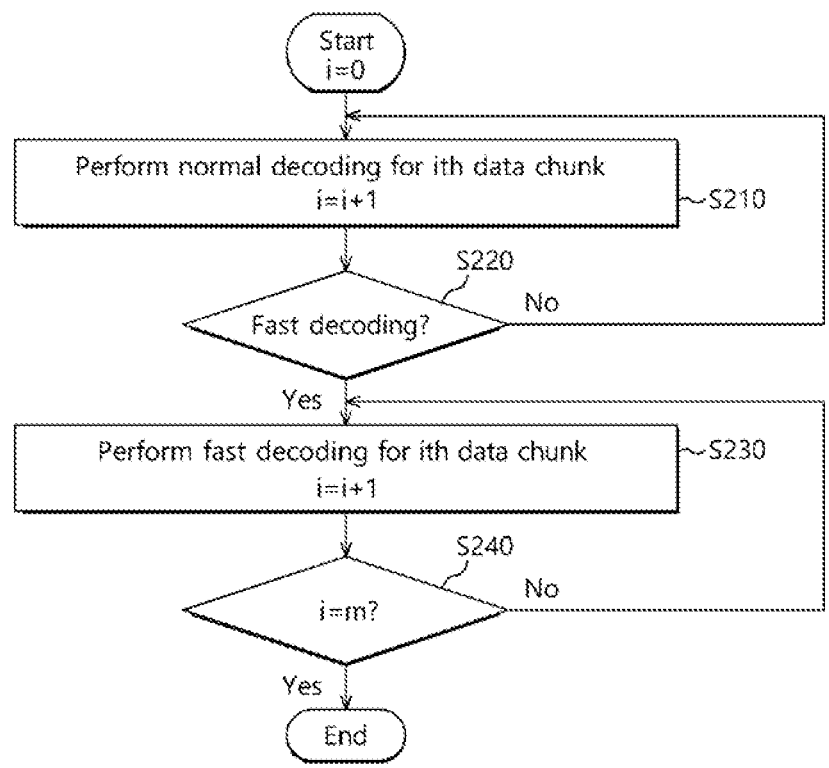
FIG. 4 is a flow chart illustrating a method for decoding one or more data chunks read sequentially, performed by a first decoder of a data processing device, according to an embodiment of the invention.

FIG. 4 is a flow chart illustrating a method for decoding a plurality of data chunks which are read sequentially from a nonvolatile memory device 200. The method may be performed by a first decoder 121 a data processing block as the one shown in FIG. 1. For example, index i shown in FIG. 4 may be "0" and m may be any positive integer.

At step S210, the first decoder 121 may perform normal decoding for an $i^{th}$ data chunk. The index i may be increased by "1."

At step S220, the first decoder 121 may determine whether to perform fast decoding, based on a result of the normal decoding for the $i^{th}$ data chunk. In the case where it is determined that the fast decoding is not to be performed, the process may proceed to the step S210. For example, the first decoder 121 may perform normal decoding for a succeeding data chunk. In the case where it is determined that the fast decoding is to be performed, the process may proceed to step S230. A method for determining whether to perform a fast decoding will be described later in detail with reference to FIGS. 5A to 5C.

At step S230, the first decoder 121 may perform fast decoding for the $i^{th}$ data chunk. For example, the first decoder 121 may perform fast decoding by processing the $i^{th}$ data chunk in a bypass mode. For example, the first decoder 121 may perform the fast decoding by inserting an error bit in the $i^{th}$ data chunk and performing normal decoding for the error-inserted data chunk. For example, when the first decoder 121 performs normal decoding within the limit of a first maximum iteration count according to an iterative decoding scheme, the first decoder 121 may perform fast decoding within the limit of a second maximum iteration count smaller than the first maximum iteration count. The index i may be increased by "1."

At step S240, the first decoder 121 may determine whether decoding has been completed for m number of data chunks. In the case where decoding for the m number of data chunks is not completed, the process may proceed to the step S230. Hence, the first decoder 121 may continuously perform fast decoding for succeeding data chunks. In the case where the decoding for the m number of data chunks is completed, the process may be ended.

Figure 5A:
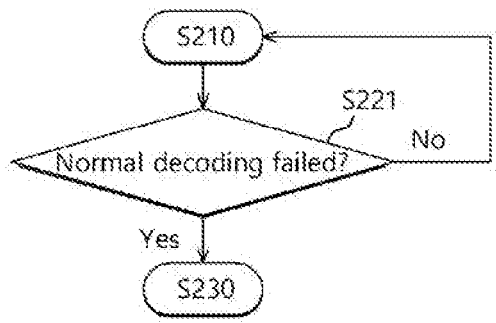
FIGS. 5A to 5C are flow charts illustrating methods performed by a first decoder of a data processing device for determining whether to perform fast decoding for a succeeding data chunk, based on a result of normal decoding for a previous data chunk, according to an embodiment of the invention.
Figure 5B:
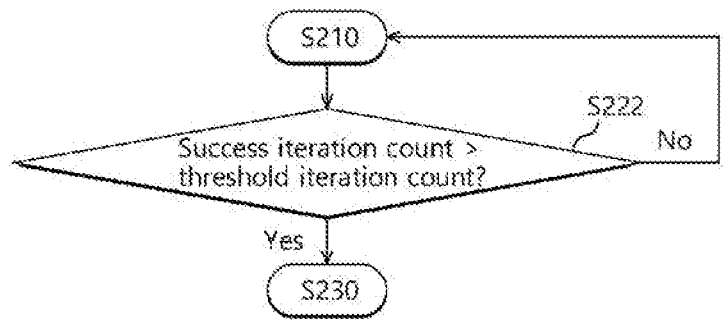
Figure 5C:
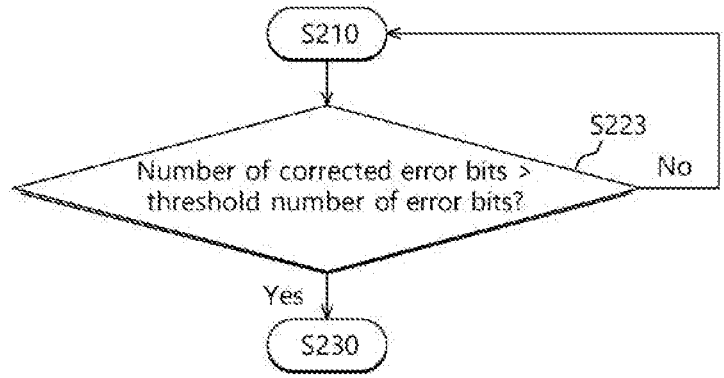

FIGS. 5A to 5C are flow charts illustrating methods performed by the first decoder 121 of FIG. 1 for determining whether to perform fast decoding for a succeeding data chunk, based on a result of normal decoding for a previous data chunk. Steps S221 to S223 may be detailed embodiments of step S220 of FIG. 4. Steps S221 to S223 may be performed between step S210 and step S230 of FIG. 4.

Referring to FIG. 5A, at step S221, the first decoder 121 may determine whether normal decoding for a data chunk is a failure or a success. When the normal decoding for a data chunk is a success, the first decoder 121 may determine to perform normal decoding for a succeeding data chunk, and the process may proceed to the step S210. When the normal decoding for a data chunk is a failure, the first decoder 121 may determine to perform fast decoding for the succeeding data chunk, and the process may proceed to the step S230.

Referring to FIG. 5B, at the step S222, the first decoder 121 may determine whether an iteration count of successful normal decoding for a data chunk, that is, a success iteration count, exceeds a threshold iteration count. When the success iteration count does not exceed the threshold iteration count, the first decoder 121 may determine to perform normal decoding for a succeeding data chunk, and the process may proceed to the step S210. When a success iteration count exceeds the threshold iteration count, the first decoder 121 may determine to perform fast decoding for the succeeding data chunk and the process may proceed to the step S230.

Figure 6:
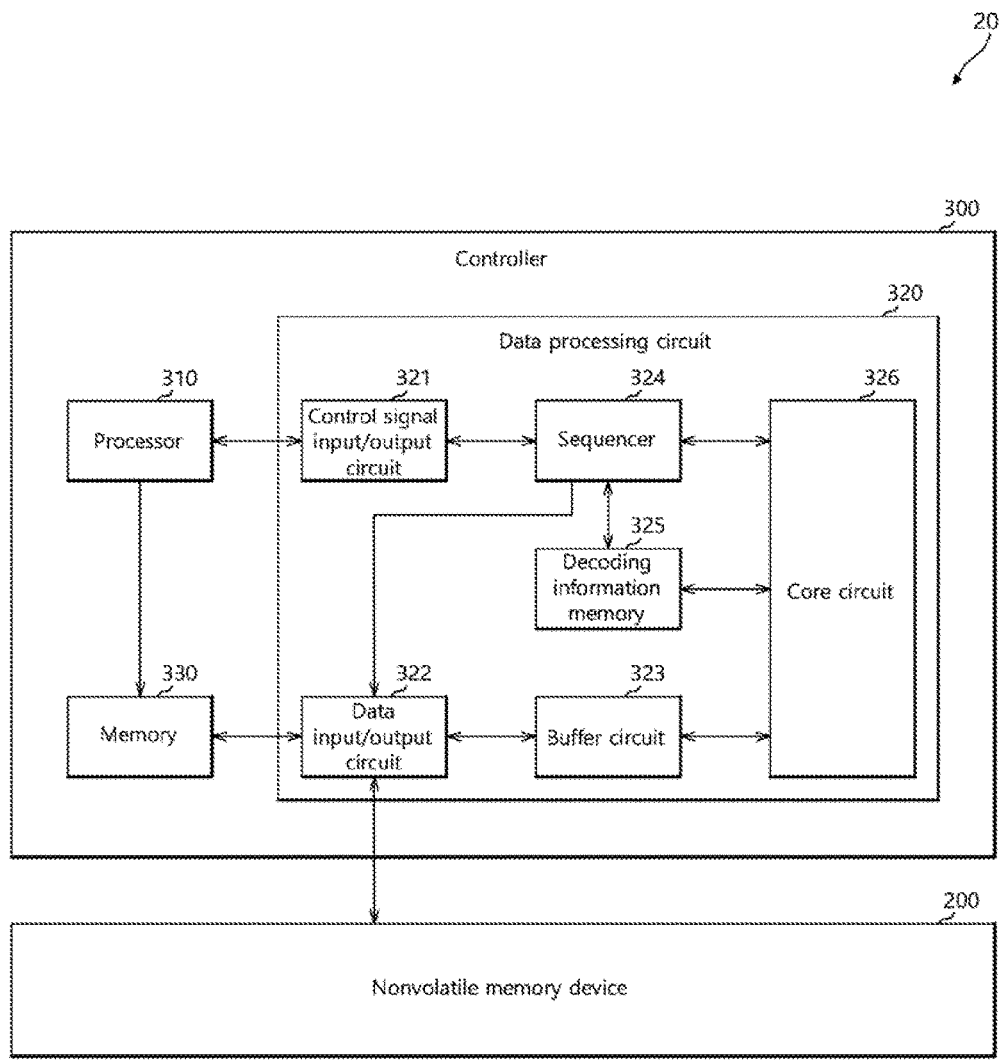
FIG. 6 is a block diagram illustrating a representation of an example of a data storage device 20 in accordance with an embodiment.

Referring to FIG. 5C, at step S223, the first decoder 121 may determine whether the number of error bits corrected in normal decoding for a data chunk exceeds a threshold number of error bits. When the number of corrected error bits does not exceed the threshold number of error bits, the first decoder 121 may determine to perform normal decoding for a succeeding data chunk and the process may proceed to step S210. When the number of corrected error bits exceeds the threshold number of error bits, the first decoder 121 may determine to perform fast decoding for the succeeding data chunk and the process may proceed to step S230. FIG. 6 is a block diagram illustrating a representation of an example of a data storage device 20 in accordance with an embodiment.

Referring to FIG. 6, the data storage device 20 may include a controller 300 and a nonvolatile memory device 200.

The controller 300 may include a processor 310, a data processing block 320 and a memory 330.

The processor 310 may control general operations of the data storage device 20. The processor 310 may store data in the nonvolatile memory device 200 in response to a write request transmitted from an external device, and may read data stored in the nonvolatile memory device 200 and output the read data to the external device in response to a read request transmitted from the external device.

The processor 310 may control the data processing block 320 to cause the data processing block 320 to perform decoding on data read from the nonvolatile memory device 200. The processor 310 may control the data processing block 320 by transmitting a control signal to the data processing block 320. The control signal may include an information on the size of data read from the nonvolatile memory device 200, that is, an information on the size of data on which the data processing block 320 is to perform decoding, an information on an address of a memory where data is to be stored, an information on a decoding type, and so forth.

The data processing block 320 may perform decoding on data read from the nonvolatile memory device 200, under the control of the processor 310. In detail, the data processing block 320 may perform decoding on data, by determining whether the data includes an error bit and correcting the error bit. As aforementioned, the data processing block 320 may perform decoding by the unit of data chunk. That is to say, the data processing block 320 may perform decoding, at once, on the bits included in a data chunk.

The data processing block 320 may include a control signal input/output circuit 321, a data input/output circuit 322, a buffer circuit 323, a sequencer 324, a decoding information memory 325 and a core circuit 326.

The control signal input/output circuit 321 may receive the control signal from the processor 310 and transmit a control signal to the sequencer 324. Also, the control signal input/output circuit 321 may transmit informations, for example, a decoding end information, a decoding result information and so fourth, to the processor 310 under the control of the sequencer 324.

The data input/output circuit 322 may receive data from the nonvolatile memory device 200 and transmit the data to the buffer circuit 323. The data input/output circuit 322 may output data stored in the buffer circuit 323, to the memory 330, when decoding on the data stored in the buffer circuit 323 is performed.

The buffer circuit 323 may receive data from the data input/output circuit 322 and store the received data. The buffer circuit 323 may transmit data to the core circuit 326 such that decoding is performed by the core circuit 326. The buffer circuit 323 may receive decoded data from the core circuit 326 and store the received data. In other words, the buffer circuit 323 may temporarily store data decoded/to be decoded by the core circuit 326.

The sequencer 324 may receive the control signal from the control signal input/output circuit 321 and control the internal components of the data processing block 320 based on the control signal. In particular, the sequencer 324 may generate a decoding information to be referred to by the core circuit 326 when performing decoding, based on the control signal. The sequencer 324 may store the decoding information in the decoding information memory 325 which may be accessed by the core circuit 326. According to an embodiment, the sequencer 324 may directly transmit the decoding information to the core circuit 326.

For example, the decoding information may include the information on the size of data read from the nonvolatile memory device 200. For example, the decoding information may include the number of data chunks. The number of data chunks may be determined through dividing the size of data read from the nonvolatile memory device 200 by the size of a data chunk or may be inputted from the processor 310.

According to an embodiment, the decoding information may include a maximum decoding iteration count. The maximum decoding iteration count may be a maximum count by which the core circuit 326 may iteratively perform decoding on a single data chunk.

According to an embodiment, the decoding information may include a decoding type. The decoding type may be for which decoding the core circuit 326 is to perform. The decoding type may include normal decoding, fast decoding and additional decoding.

In detail, first, the sequencer 324 may generate the decoding information such that the core circuit 326 performs normal decoding on a first data chunk among a plurality of data chunks.

When the sequencer 324 receives from the core circuit 326 a report that a fast decoding condition is satisfied, the sequencer 324 may modify the decoding information such that the core circuit 326 performs a fast decoding operation on a second data chunk. An execution time of fast decoding may be shorter than an execution time of normal decoding. The second data chunk may include at least one data chunk which is subsequent to the first data chunk, among the plurality of data chunks. The second data chunk may include at least one data chunk on which normal decoding is not performed yet, among the plurality of data chunks.

When the sequencer 324 receives from the core circuit 326 a report on a result of normal decoding or fast decoding on all the data chunks, the sequencer 324 may modify the decoding information such that the core circuit 326 performs additional decoding on a third data chunk. The third data chunk may include a data chunk on which normal decoding has failed and on which fast decoding has been performed, among the plurality of data chunks. Additional decoding may have better error correction performance and longer execution time than normal decoding.

The decoding information memory 325 may be accessed by the sequencer 324 and the core circuit 326, and may store informations which are to be transmitted between the sequencer 324 and the core circuit 326. For example, the decoding information memory 325 may store the decoding information generated/modified by the sequencer 324, a result determined by the core circuit 326 in terms of whether a fast decoding condition is satisfied, a result of performing decoding on the plurality of data chunks by the core circuit 326, and so forth.

The core circuit 326 may read the decoding information stored in the decoding information memory 325 or receive the decoding information from the sequencer 324. The core circuit 326 may read a data chunk from the buffer circuit 323 based on the decoding information and perform decoding on the data chunk.

In detail, the core circuit 326 may sequentially perform normal decoding on data chunks stored in the buffer circuit 323, when the decoding information of the sequencer 324 instructs normal decoding. At each time of performing normal decoding on a data chunk, the core circuit 326 may determine whether a result of normal decoding satisfies the fast decoding condition.

The result of normal decoding may include at least one among whether normal decoding is a failure, whether the number of error bits corrected in normal decoding exceeds a threshold number even though normal decoding is a success and whether a decoding iteration count in normal decoding exceeds a threshold iteration count. Namely, a case where the fast decoding condition is satisfied may include at least one among a case where normal decoding has failed, a case where the number of error bits corrected in normal decoding exceeds the threshold number and a case where a decoding iteration count in normal decoding exceeds the threshold iteration count.

When the fast decoding condition is satisfied, the core circuit 326 may report through the decoding information memory 325 or directly to the sequencer 324 that the fast decoding condition is satisfied.

When the decoding information of the sequencer 324 instructs fast decoding, the core circuit 326 may perform fast decoding on a subsequent data chunk which is stored in the buffer circuit 323. The core circuit 326 may perform fast decoding on data chunks on which normal decoding is not performed yet, among the data chunks stored in the buffer circuit 323.

Describing in detail a method for the core circuit 326 to perform fast decoding on a data chunk, for example, when the core circuit 326 performs normal decoding based on a first maximum iteration count, the core circuit 326 may perform fast decoding based on a second maximum iteration count smaller than the first maximum iteration count. The first maximum iteration count and the second maximum iteration count may be determined as the decoding information by the sequencer 324.

According to an embodiment, when fast decoding is performed on a data chunk, the data chunk may be outputted to the memory 330 through the data input/output circuit 322 without passing through the core circuit 326. That is to say, the data chunk stored in the buffer circuit 323 may be outputted to the memory 330 by bypassing the core circuit 326.

After performing normal decoding or fast decoding on all the data chunks, the core circuit 326 may report a decoding result through the decoding information memory 325 or directly to the sequencer 324.

When the decoding information of the sequencer 324 instructs additional decoding, the core circuit 326 may perform additional decoding on a data chunk which is selected among the data chunks. The core circuit 326 may perform additional decoding on a data chunk on which normal decoding has failed or a data chunk on which fast decoding has been performed, among the data chunks.

The memory 330 may serve as a working memory, a cache memory or a buffer memory of the processor 310. The memory 330 as a working memory may store software programs and various program data to be driven by the processor 310. The memory 330 as a cache memory may temporarily store cache data. The memory 330 as a buffer memory may temporarily store data to be transmitted between the external device and the data processing block 320. For example, the memory 330 may store data transmitted from the data input/output circuit 322, until it is transmitted to the external device.

According to an embodiment, the buffer circuit 323 may have a smaller capacity, and the memory 330 may have a larger capacity. In this case, the buffer circuit 323 may not be able to store at once all data chunks read from the nonvolatile memory device 200. Therefore, a data chunk on which decoding is performed by the core circuit 326 may be once outputted to the memory 330 without being retained in the buffer circuit 323 for a long time. For example, data on which normal decoding or fast decoding is performed by the core circuit 326 may be outputted to the memory 330 immediately after being stored in the buffer circuit 323. Then, a data chunk on which normal decoding has failed and a data chunk on which fast decoding has been performed, among the data chunks stored in the memory 330, may be transmitted again to the buffer circuit 323 to be applied with additional decoding of the core circuit 326.

Since the nonvolatile memory device 200 is similar to the nonvolatile memory device 200 of FIG. 1, detailed description thereof will be omitted herein.

Figure 7:
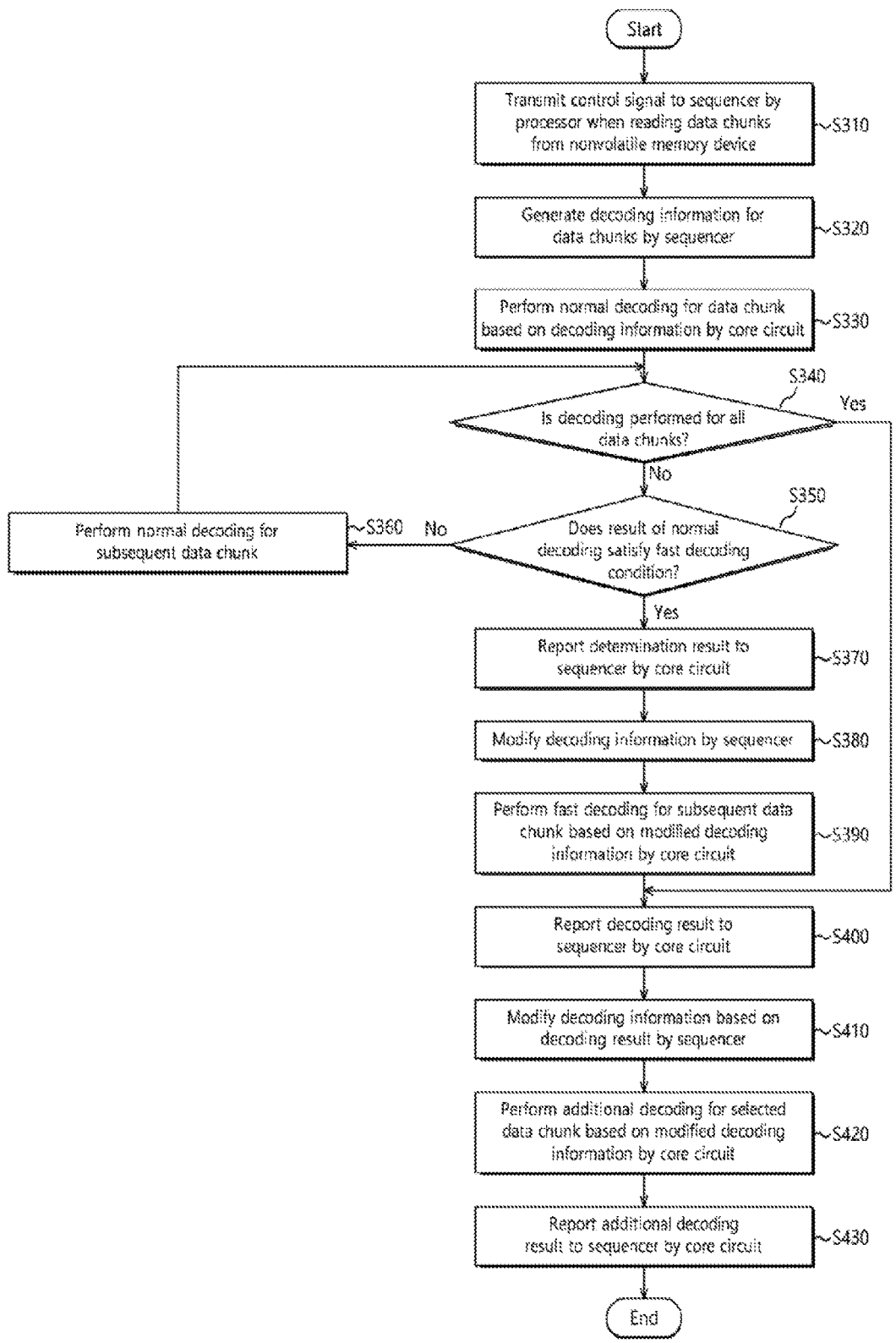
FIG. 7 is a representation of an example of a flow chart to assist in the explanation of a method for operating the data storage device 20 of FIG. 6 in accordance with an embodiment.

FIG. 7 is a representation of an example of a flow chart to assist in the explanation of a method for operating the data storage device 20 of FIG. 6 in accordance with an embodiment.

Referring to FIG. 7, at step S310, when reading data chunks from the nonvolatile memory device 200, the processor 310 may transmit a control signal to the sequencer 324. Data chunks may be read from the nonvolatile memory device 200, be transmitted to the buffer circuit 323 through the data input/output circuit 322 of the data processing block 320, and be stored in the buffer circuit 323. The control signal of the sequencer 324 may include an information on the size of data chunks.

At step S320, the sequencer 324 may generate a decoding information on the data chunks based on the control signal. The decoding information may include the number of all data chunks, a maximum decoding iteration count and a decoding type. At this time, the decoding type may indicate normal decoding. The sequencer 324 may store the decoding information in the decoding information memory 325 or directly transmit the decoding information to the core circuit 326.

At step S330, the core circuit 326 may perform normal decoding on a data chunk which is stored in the buffer circuit 323, based on the decoding information.

At step S340, the core circuit 326 may determine whether decoding has been performed on all data chunks on which decoding is instructed from the sequencer 324. The core circuit 326 may determine whether decoding has been performed on all data chunks, based on the number of data chunks included in the decoding information. When it is determined that decoding has been performed on all data chunks, the process may proceed to step S400. When it is determined that decoding has not been performed on all data chunks, the process may proceed to step S350.

At the step S350, the core circuit 326 may determine whether a result of normal decoding performed immediately before satisfies a fast decoding condition. A case where a result of normal decoding satisfies the fast decoding condition may include at least one among a case where normal decoding has failed, a case where the number of error bits corrected in normal decoding exceeds a threshold number and a case where a decoding iteration count in normal decoding exceeds a threshold iteration count. When it is determined that a result of normal decoding satisfies the fast decoding condition, the process may proceed to step S370. When it is determined that a result of normal decoding does not satisfy the fast decoding condition, the process may proceed to step S360.

At the step S360, the core circuit 326 may perform normal decoding on a subsequent data chunk which is stored in the buffer circuit 323.

At the step S370, the core circuit 326 may report to the sequencer 324 a determination result that a result of normal decoding satisfies the fast decoding condition.

At step S380, the sequencer 324 may modify the decoding information based on the determination result. The modified decoding information may include a decoding type indicating fast decoding. The sequencer 324 may store the modified decoding information in the decoding information memory 325 or directly transmit the modified decoding information to the core circuit 326.

At step S390, the core circuit 326 may perform fast decoding on at least one subsequent data chunk which is stored in the buffer circuit 323, based on the modified decoding information. An execution time of fast decoding may be shorter than an execution time of normal decoding.

The core circuit 326 may perform fast decoding on all the remaining data chunks on which normal decoding has not been performed.

At the step S400, the core circuit 326 may report a decoding result to the sequencer 324. The core circuit 326 may report to the sequencer 324 that normal decoding or fast decoding has been performed for all the data chunks, as the decoding result.

At step S410, the sequencer 324 may modify the decoding information based on the decoding result. The modified decoding information may include a decoding type indicating additional decoding. According to an embodiment, the modified decoding information may indicate at least one selected data chunk on which additional decoding is to be performed. The sequencer 324 may store the modified decoding information in the decoding information memory 325 or directly transmit the modified decoding information to the core circuit 326.

At step S420, the core circuit 326 may perform additional decoding on a data chunk which is selected among all the data chunks, based on the modified decoding information. The core circuit 326 may perform additional decoding on a data chunk on which normal decoding has failed or a data chunk on which fast decoding has been performed, among all the data chunks.

At step S430, the core circuit 326 may report an additional decoding result to the sequencer 324. The core circuit 326 may report to the sequencer 324 whether additional decoding on selected data chunks is a success/failure, as the additional decoding result. Then, when additional decoding is a success, the sequencer 324 may transmit a decoding end signal to the processor 310 such that all the data chunks are transmitted to the external device.

Figure 8:
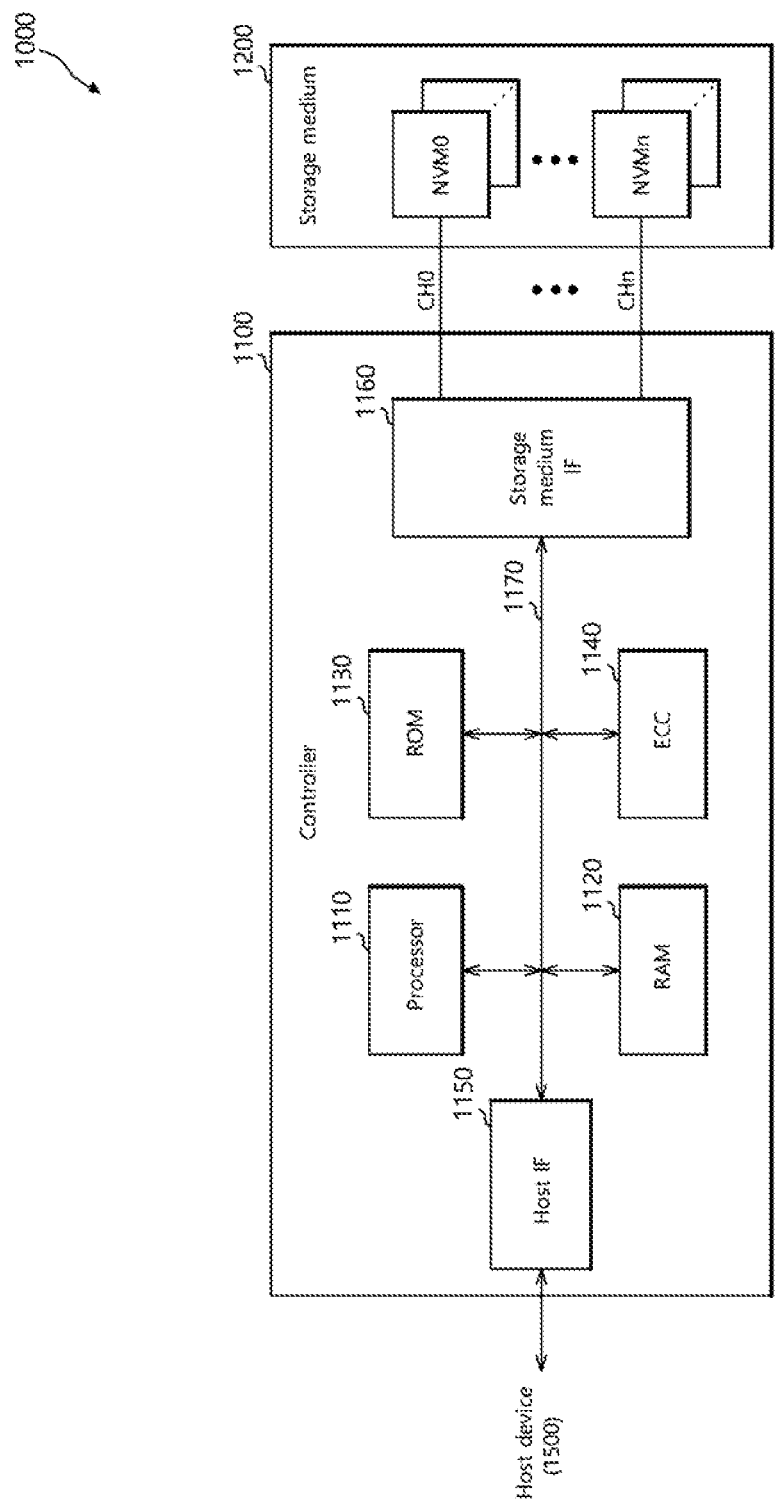
FIG. 8 is a block diagram illustrating a solid state drive (SSD), according to an embodiment of the invention.

FIG. 8 is a block diagram illustrating a solid state drive (SSD) 1000, according to an embodiment of the invention, the SSD 1000 comprising a controller 1100 and a storage medium 1200.

The controller 1100 may control the data exchange between a host device 1500 and the storage medium 1200. The controller 1100 may include a processor 1110, a RAM 1120, a ROM 1130, an ECC unit 1140, a host interface 1150, and a storage medium interface 1160.

The processor 1110 may control the general operations of the controller 1100. The processor 1110 may store data in the storage medium 1200 and read stored data from the storage medium 1200, in response to data processing requests from the host device 1500. In order to efficiently manage the storage medium 1200, the processor 1110 may control the internal operations of the SSD 1000 such as a merge operation, a wear leveling operation, and so forth. The processor 1110 may operate in a manner substantially similar to the processor 110 shown in FIG. 1.

The RAM 1120 may store programs and program data to be used by the processor 1110. The RAM 1120 may temporarily store the data transmitted from the host interface 1150 before transferring it to the storage medium 1200. The RAM 1120 may temporarily store the data transmitted from the storage medium 1200 before transferring it to the host device 1500.

The ROM 1130 may store program codes to be read by the processor 1110. The program codes may include commands to be processed by the processor 1110, in order for the processor 1110 to control the internal units of the controller 1100.

The ECC unit 1140 may decode the data read from the storage medium 1200. The ECC unit 1140 may operate in a manner substantially similar to the data processing block 120 shown in FIG. 1. When decoding a plurality of data chunks sequentially read from the storage medium 1200, the ECC unit 1140 may perform normal decoding or fast decoding for a succeeding data chunk, based on a result of normal decoding for a previous data chunk. The ECC unit 1140 may include a plurality of decoders which perform decoding in a stepwise manner. The plurality of decoders may perform additional decoding for data chunks which the previous decoders thereof have failed to decode.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation under the control of the controller 1100.

FIG. 9 is a block diagram illustrating a data processing system 2000 including a data storage device according to an embodiment of the invention.

The data processing system 2000 may be or comprise a computer, a laptop, a netbook, a smart phone, a digital TV, a digital camera, a navigator, or the like. For example, the data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control the general operations of the data processing system 2000. The main processor 2100 may be, for example, a central processing unit such as a microprocessor. The main processor 2100 may execute the softwares of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a memory controller 2310 and a storage medium 2320. The data storage device 2300 may be configured and operate in a substantially similar way as the data storage device 10 shown in FIG. 1.

The input/output device 2400 may include a keyboard, a scanner, a touch screen, a mouse, or the like, capable of exchanging data with a user. The input/output device 2400 may receive a command for controlling the data processing system 2000 from the user or provide a processed result to the user.

According to an embodiment, the data processing system 2000 may communicate with at least one server 2700 through a network 2600 such as a LAN (local area network), a WAN (wide area network), a wireless network, and the like. The data processing system 2000 may include a network interface (not shown) to access the network 2600.

While various embodiments have been described above, it will be understood to those skilled in the art that the embodiments are examples of the invention only and that the invention is not intended to be limited to these embodiments. Many other embodiments and variations of the invention may be envisioned by those skilled in the art to which the invention pertains without departing from the spirit and scope of the invention as defined by the appended claims.

What is claimed is:

1. A data storage device comprising:
a nonvolatile memory device configured to read and output a plurality of data chunks; and
a data processing block configured to perform decoding on the data chunks,
the data processing block comprising
a sequencer configured to generate a decoding information on the data chunks; and
a core circuit configured to perform normal decoding on a first data chunk among the data chunks based on the decoding information, and perform fast decoding on a second data chunk among the data chunks depending on whether a result of the normal decoding satisfies a fast decoding condition,
wherein the fast decoding requires a shorter execution time than the normal decoding.

2. The data storage device according to claim 1,
wherein the core circuit determines whether the fast decoding condition is satisfied, and reports a determination result to the sequencer,
wherein the sequencer modifies the decoding information based on the determination result, and
wherein the core circuit performs the fast decoding based on a modified decoding information.

3. The data storage device according to claim 2, wherein the data processing block further comprises:
a decoding information memory accessed by the sequencer and the core circuit, and configured to store the decoding information and the determination result.

4. The data storage device according to claim 1, wherein the result of the normal decoding includes at least one among whether the normal decoding is a failure, whether the number of error bits corrected in the normal decoding exceeds a threshold number and whether a decoding iteration count in the normal decoding exceeds a threshold iteration count.

5. The data storage device according to claim 1, wherein the second data chunk includes at least one data chunk on which the normal decoding is not performed, among the data chunks.

6. The data storage device according to claim 1, wherein the core circuit performs the normal decoding on the second data chunk when the fast decoding condition is not satisfied.

7. The data storage device according to claim 1,
wherein the core circuit reports a decoding result to the sequencer after performing the normal decoding or the fast decoding on all the data chunks,
wherein the sequencer modifies the decoding information based on the decoding result, and
wherein the core circuit performs additional decoding on a third data chunk among the data chunks based on a modified decoding information.

8. The data storage device according to claim 7, wherein the third data chunk includes a data chunk on which the normal decoding has failed and a data chunk on which the fast decoding has been performed, among the data chunks.

9. The data storage device according to claim 1, wherein the core circuit performs the normal decoding based on a first maximum iteration count, and performs the fast decoding based on a second maximum iteration count smaller than the first maximum iteration count.

10. The data storage device according to claim 9, wherein the sequencer determines the first maximum iteration count and the second maximum iteration count as the decoding information.

11. The data storage device according to claim 1, further comprising:
a memory configured to receive a data chunk from the data processing block and store the data chunk until the data chunk is transmitted to an external device,
wherein the data processing block further comprises:
a buffer circuit configured to temporarily store a data chunk to be decoded/decoded by the core circuit; and
a data input/output circuit configured to receive the data chunk to be decoded, from the nonvolatile memory device and transmit the data chunk to the buffer circuit, and output the decoded data chunk stored in the buffer circuit, to the memory.

12. The data storage device according to claim 11,
wherein the data processing block performs an additional decoding after performing the fast decoding on the second data chunk, and
wherein the memory temporarily stores the second data chunk until the additional decoding is performed after the fast decoding is performed on the second data chunk.

13. The data storage device according to claim 11, wherein, when the fast decoding is performed, the second data chunk is outputted to the memory through the data input/output circuit from the buffer circuit without passing through the core circuit.

14. The data storage device according to claim 1, further comprising:
a processor configured to control the nonvolatile memory device to cause the nonvolatile memory device to read the data chunks and output them to the data processing block, and control the data processing block by providing an information on a size of the data chunks to the data processing block to cause the data processing block to perform the decoding on the data chunks.

* * * * *